（12）United States Patent
Imai

(10) Patent No.: US 9,035,190 B2
(45) Date of Patent: May 19, 2015

(54) FLEXIBLE CIRCUIT BOARD AND DISPLAY DEVICE

(75) Inventor: Masahiro Imai, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 336 days.

(21) Appl. No.: 13/501,828

(22) PCT Filed: Sep. 1, 2010

(86) PCT No.: PCT/JP2010/064890
§ 371 (c)(1),
(2), (4) Date: Apr. 13, 2012

(87) PCT Pub. No.: WO2011/045985
PCT Pub. Date: Apr. 21, 2011

(65) Prior Publication Data
US 2012/0199382 A1 Aug. 9, 2012

(30) Foreign Application Priority Data
Oct. 16, 2009 (JP) ................................. 2009-239659

(51) Int. Cl.
H05K 1/03 (2006.01)
H05K 1/02 (2006.01)
H05K 1/14 (2006.01)

(52) U.S. Cl.
CPC .............. *H05K 1/0224* (2013.01); *H05K 1/038* (2013.01); *H05K 1/0393* (2013.01); *H05K 1/147* (2013.01); *H05K 2201/09681* (2013.01); *H05K 2201/0969* (2013.01); *H05K 2201/10136* (2013.01)

(58) Field of Classification Search
CPC ....................................................... H05K 1/038
See application file for complete search history.

(56) References Cited

U.S. PATENT DOCUMENTS 5,675,299 A * 10/1997 Suski ................................ 333/1
2007/0227764 A1 10/2007 Honjo
2009/0321727 A1* 12/2009 Yutani et al. ..................... 257/40

FOREIGN PATENT DOCUMENTS

JP 2007-281000 A 10/2007
JP 2008-270621 A 11/2008

* cited by examiner

Primary Examiner — Jeremy C Norris
(74) Attorney, Agent, or Firm — Chen Yoshimura LLP

(57) ABSTRACT

The present invention has an object of obtaining excellent anti-noise performance and a high level of flexibility in a flexible circuit board. A flexible circuit board 13 according to the present invention has a flexible insulating base material 21, a plurality of wiring patterns 22 formed at prescribed intervals on one surface 21a of the insulating base material 21, and a conductive layer 23 formed on the other surface 21b of the insulating base material 21. The conductive layer 23 is disposed so as to overlap first wiring patterns 22A, which is a select set among the plurality of wiring patterns 22, and does not overlap all of the wiring patterns 22.

15 Claims, 8 Drawing Sheets

FLEXIBLE CIRCUIT BOARD AND DISPLAY DEVICE

TECHNICAL FIELD

The present invention relates to a flexible circuit board and to a display device.

BACKGROUND ART

Display devices represented by portable terminal devices, such as a mobile phone, a PDA, and the like, and by electronic devices, such as a computer, a television, and the like, have many electronic components inside them. These electronic components are electrically connected to each other through a wiring circuit board or the like. As the display devices are becoming thinner and smaller in recent years, a space to store the wiring circuit board should be as small as possible. Thus, a highly flexible wiring circuit board that can be bent or folded in a flexible manner is needed, and a wiring circuit board disclosed in Patent Document 1 below has been known, for example.

In the wiring circuit board described in Patent Document 1, wiring patterns are formed on one surface of a base insulating layer, and a ground pattern is formed on the other surface. Here, it is said that the wiring circuit board can secure pliability (flexibility) by disposing the ground pattern such that it is positioned in regions between the wiring patterns (in a stripe shape, for example) instead of forming the ground pattern on the entire surface of the other surface of the base insulating layer.

RELATED ART DOCUMENTS

Patent Documents

Patent Document 1: Japanese Patent Application Laid-Open Publication No. 2007-281000

Problems to be Solved by the Invention

However, in the wiring circuit board described in Patent Document 1, the ground pattern is disposed so as to be positioned in regions between all of the wiring patterns. As a result, the areas where the ground pattern is disposed are relatively large. Because of this, this wiring circuit board is highly resistant to bending movement, and it cannot be said that it has a sufficient level of flexibility. Therefore, there has been room for improvement in flexibility. Furthermore, in this wiring circuit board, in addition to the ground pattern, a thin metal film for shielding is formed on the entire area of the base insulating layer. As a result, the level of flexibility was lowered by the thin metal film.

SUMMARY OF THE INVENTION

The present invention was accomplished in light of the above issues, and has an object to obtain a high level of flexibility.

Means for Solving the Problems

A flexible circuit board of the present invention has a flexible insulating base material, a plurality of wiring patterns formed at prescribed intervals on one surface of the insulating base material, and a conductive layer formed on the other surface of the insulating base material. The conductive layer is disposed so as to overlap a select wiring pattern among the plurality of wiring patterns.

As described, the plurality of wiring patterns are formed on one surface of the insulating base material, and the conductive layer is formed on the other surface. The conductive layer is disposed so as to overlap the select wiring pattern. Because of this, the wiring patterns overlapping the conductive layer can be suitably shielded. As a wiring pattern to be overlapped by the conductive layer, if a wiring pattern in which a transmitted signal is particularly likely to deteriorate due to an external noise or a wiring pattern in which effects caused by deterioration of a signal are particularly large is selected among the plurality of wiring patterns, it is possible to secure desired anti-noise performance in the wiring pattern. Furthermore, the conductive layer is disposed so as to overlap a select wiring pattern instead of overlapping all of the wiring patterns. Therefore, compared to a case in which the conductive layer is disposed to overlap all of the wiring patterns and a case in which the conductive layer is disposed to be positioned in regions between all of the wiring patterns, the area where the conductive layer is disposed on the insulating base material becomes smaller. As a result, a high level of flexibility (pliability) can be secured.

As modes of the present invention, the following configurations are preferable.

(1) The conductive layer has an opening that runs through the conductive layer. When the opening is formed in the conductive layer in this way, the rigidity of the conductive layer is lowered, thereby making it easier to change its shape. As a result, it is possible to further improve the flexibility of the flexible circuit board.

(2) The opening is disposed to overlap the select wiring pattern, and runs across the select wiring pattern. This way, flexibility of the flexible circuit board can be suitably secured by forming the opening running across the select wiring pattern.

(3) The select wiring pattern overlapping the conductive layer is constituted of a plurality of the wiring patterns. The opening is formed such that areas overlapping the respective wiring patterns constituting the select wiring pattern are substantially equal to each other. This way, the areas of the overlapping portions of the opening with respect to the respective wiring patterns constituting the select wiring pattern are substantially equal. As a result, electromagnetic effects of the conductive layer with respect to the respective wiring patterns become similar to each other. Because of this, a difference in impedance becomes less likely to occur between the respective wiring patterns constituting the select wiring pattern, and signals can be transmitted in a further improved manner.

(4) The opening has a symmetrical shape with respect to a symmetry axis that is parallel to a plurality of the wiring patterns constituting the select wiring pattern. This way, by making the shape of the opening a symmetrical shape, a difference in impedance becomes even less likely to occur between the respective wiring patterns constituting the select wiring pattern, and signals can be transmitted in an even more excellent manner.

(5) The opening runs across the select wiring pattern and is formed in regions that do not overlap the select wiring pattern. This way, the range where the opening is formed extends beyond the select wiring pattern. Therefore, it is possible to further improve flexibility of the flexible circuit board.

(6) The select wiring pattern overlapping the conductive layer is constituted of a plurality of the wiring patterns. The opening is formed so as to straddle the wiring patterns that are adjacent to each other. This way, compared to a case in which an opening is formed individually in each wiring pattern, the amount of the opening becomes larger, thereby further improving flexibility of the flexible circuit board. Further, when the pitch between the wiring patterns is particularly small, the opening can be formed in the conductive layer in a simple manner.

(7) A plurality of the openings are arranged side by side along an extending direction of the select wiring pattern. This way, it is possible to further improve flexibility of the flexible circuit board.

(8) The openings are arranged such that intervals between the openings adjacent to each other are substantially equal. This way, it is possible to make flexibility of the flexible circuit board substantially uniform in the extending direction of the wiring patterns by arranging the plurality of openings at substantially equal pitches.

(9) The select wiring pattern overlapping the conductive layer is a wiring pattern that transmits a differential signal. The differential signal has a small voltage swing and a high frequency. Because of this, the differential signal is likely to deteriorate when it is affected by an external noise, and it has a high possibility of causing malfunction in a connected device. By shielding the wiring pattern transmitting the differential signal in a more selective manner using the conductive layer, the differential signal can be suitably transmitted.

(10) The conductive layer extends along the extending direction of the wiring patterns. This way, the overlapping select wiring pattern can be suitably shielded by the conductive layer extending along the extending direction of the wiring patterns.

(11) The conductive layer is a ground pattern. This way, the overlapping select wiring pattern can be suitably shielded using the ground pattern.

Next, in order to solve the above-mentioned problems, a display device of the present invention has the above-mentioned flexible circuit board, a display panel that has an electrode wiring and that performs display based on a drive signal supplied to the electrode wiring, and a display control circuit that controls transmission of the drive signal, and is formed by connecting the display panel to the display control circuit through the flexible circuit board.

According to this display device, the flexible circuit board connecting the display panel to the display control circuit has excellent flexibility. Thus, wiring can be performed in a more flexible manner, which is advantageous in obtaining a smaller size and the like.

As the display panel, a liquid crystal panel can be shown as an example. This display device is suitable as a liquid crystal display device for various purposes in various types of electronic devices, such as a portable information terminal, a mobile phone, a laptop computer, a portable game device, and the like, for example.

Effects of the Invention

According to the present invention, it is possible to obtain a high level of flexibility.

DETAILED DESCRIPTION OF EMBODIMENTS

Embodiment 1

Embodiment 1 of the present invention is described with reference to FIGS. 1 to 6. In the present embodiment, a liquid crystal display device 10 is shown as an example. The liquid crystal display device 10 is used in various types of electronic devices (not shown in the figure), such as a portable information terminal, a mobile phone, a laptop computer, a portable game device, and the like. Here, at a portion of the respective figures, an X axis, a Y axis, and a Z axis are shown, and the figures are drawn such that the respective axis directions are directions that are shown in the respective figures. With respect to the vertical direction, FIG. 2 and the like are used as a reference. The upper side of the figure is a front side, and the lower side of the figure is a rear side.

Figure 1:
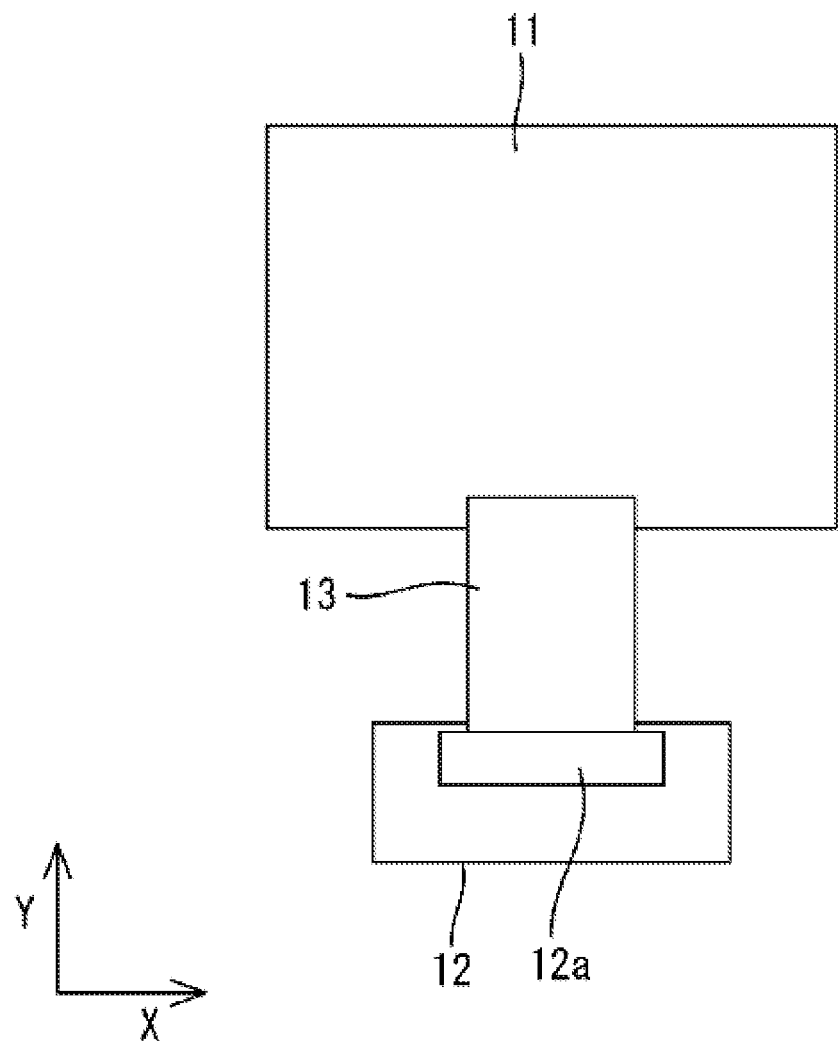
FIG. 1 is a schematic plan view showing a connection configuration of a liquid crystal panel, a flexible circuit board, and a display control circuit board according to Embodiment 1 of the present invention.
Figure 2:
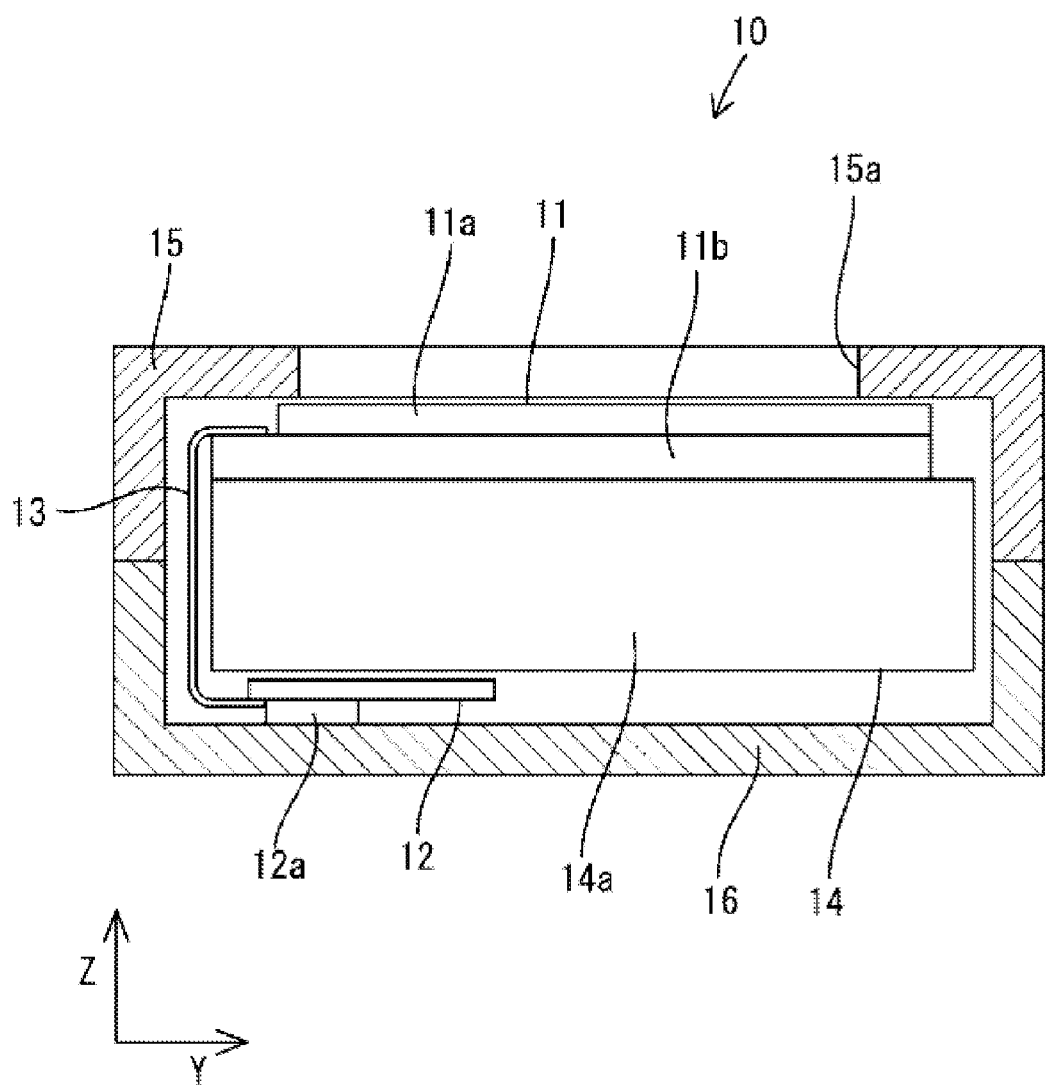
FIG. 2 is a cross-sectional view showing a cross-sectional configuration along the short side direction of a liquid crystal display device.

As shown in FIGS. 1 and 2, the liquid crystal display device 10 has a liquid crystal panel 11 that is a display panel (display element) that displays an image, a display control circuit board 12 that controls transmission of a drive signal, which drives the liquid crystal panel 11, a flexible circuit board 13 that electrically connects the liquid crystal panel 11 to the display control circuit board 12, and a backlight device (illumination device) 14 that is an external light source supplying light to the liquid crystal panel 11. Furthermore, the liquid crystal display device 10 also has a pair of front and back outer members 15 and 16 for housing and supporting the liquid crystal panel 11 and the backlight device 14, which are attached to each other. Of these, in the outer member 15 on the front side, an opening 15a for exposing a display surface of the liquid crystal panel 11 to the outside is formed.

First, the backlight device 14 is briefly described. The backlight device 14 has a chassis 14a that substantially forms a box shape having an opening towards the front side (liquid crystal panel 11 side), a light source (a cold cathode tube, an LED, or the like, for example), which is not shown in the figure, disposed inside the chassis 14a, and an optical member, which is not shown in the figure, disposed so as to cover the opening of the chassis 14a. The optical member has a function of transforming light emitted from the light source into a planar shape and the like.

Next, the liquid crystal panel 11 is described. The liquid crystal panel 11 forms a horizontally long rectangular shape (quadrangular shape) as a whole, and has a pair of clear (transparent) glass substrates 11a and 11b and a liquid crystal layer (not shown in the figure) that is disposed between the substrates 11a and 11b and that contains liquid crystal molecules, which are substances that change optical characteristics when an electric field is applied. The substrates 11a and 11b are attached to each other by a sealing material, which is not shown in the figure, with a gap having the thickness of the liquid crystal layer retained therebetween. Here, the direction of the long side of the liquid crystal panel 11 corresponds to the X axis direction, and the direction of the short side corresponds to the Y axis direction.

Figure 3:
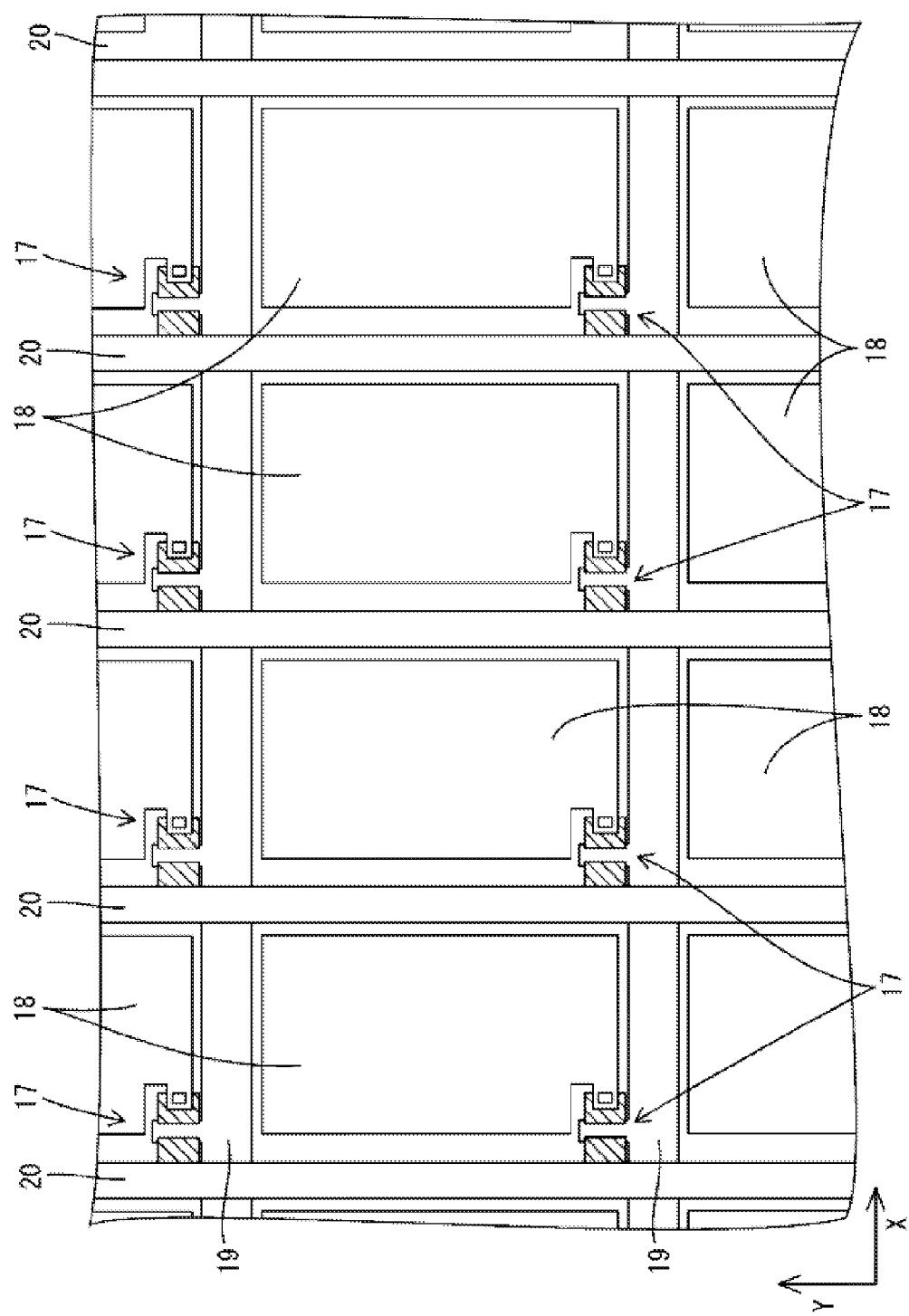
FIG. 3 is a magnified plan view showing a wiring configuration on an array substrate of a liquid crystal panel.

Of the substrates 11a and 11b, the substrate on the front side (front surface side) is a CF substrate 11a, and the substrate on the rear side (back surface side) is an array substrate 11b. As shown in FIG. 3, on the inner surface side of the array substrate 11b (liquid crystal layer side, side of the surface facing the CF substrate 11a), a plurality of TFTs (Thin Film Transistors) 17, which are switching elements, and a plurality of pixel electrodes 18 are provided side by side. Around these TFTs 17 and pixel electrodes 18, gate wires 19 and source wires 20, which form a grid pattern, are arranged so as to surround the TFTs 17 and the pixel electrodes 18. The gate wires 19 and the source wires 20 are respectively connected to gate electrodes and source electrodes of the TFTs 17, and the pixel electrodes 18 are connected to drain electrodes of the TFTs 17. At one end of the short side direction of the array substrate 11b, terminals that are led out from the gate wires 19 and the source wires 20 are formed. As shown in FIGS. 1 and 2, one end side of the above-mentioned flexible circuit board 13 is connected to the terminals. The flexible circuit board 13 is connected to the terminals by pressure through an anisotropic conductive film (ACF), which is not shown in the figure. The pixel electrodes 18 are formed of transparent electrodes such as an ITO (Indium Tin Oxide) or a ZnO (Zinc Oxide).

On the other hand, the CF substrate 11a has a color filter in which respective colored portions of R (red), G (green), B (blue), and the like are disposed in an arrangement corresponding to the respective pixels. Between the respective colored portions constituting the color filter, a light shielding layer (black matrix) for preventing colors from mixing is formed. On the surfaces of the color filter and the light shielding layer, an opposite electrode that faces the pixel electrodes on the array substrate 11b side is provided. The size of the CF substrate 11a is slightly smaller than that of the array substrate 11b. Further, on the inner surface sides of the substrates 11a and 11b, alignment films for aligning the liquid crystal molecules contained in the liquid crystal layer are respectively formed. Here, on the outer surface sides of the substrates 11a and 11b, polarizing plates, which are not shown in the figure, are respectively attached.

As shown in FIGS. 1 and 2, the display control circuit board 12 is attached to the rear surface of the chassis 14a of the backlight device 14 (outer surface on the opposite side from the liquid crystal panel 11 side) with a screw or the like. In the display control circuit board 12, electronic components (control circuits) that control transmission of drive signals to the liquid crystal panel 11 are mounted on a substrate made of paper phenolic resin or glass epoxy resin, and a conductive path (not shown in the figure) having a prescribed pattern is routed and formed. In addition, a connector 12a to be connected to the conductive path is mounted. When the other end side of the flexible circuit board 13 is inserted into the connector 12a, the display control circuit board 12 and the flexible circuit board 13 become electrically connected to each other, thereby enabling transmission of drive signals.

Next, the flexible circuit board (FPC substrate) 13 is described in detail. As shown in FIG. 2, the flexible circuit board 13 is connected to the array substrate 11b of the liquid crystal panel 11 and to the display control circuit board 12 disposed on the rear surface of the chassis 14a of the backlight device 14. Therefore, it is bent such that its cross-sectional shape is substantially in the shape of the letter "U" inside the liquid crystal display device 10. Because of this, the flexible circuit board 13 needs a sufficient level of flexibility (pliability, easy bendability). Particularly, when the space for disposing the flexible circuit board 13 becomes smaller because of a reduction in size of the liquid crystal display device 10, the required bend angle becomes steep, and the bent shape becomes complex. As a result, an even higher level of flexibility tends to be required.

Figure 4:
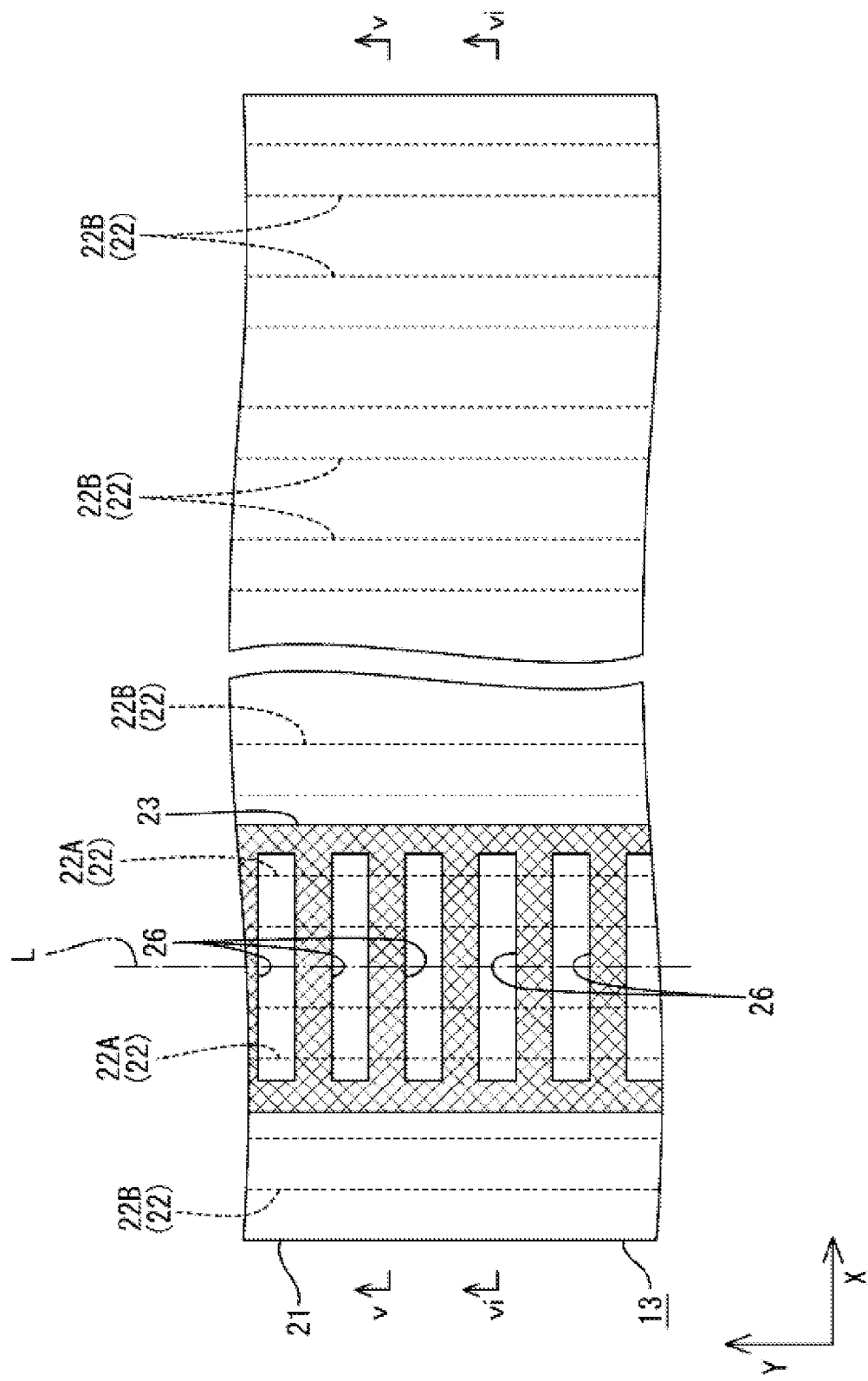
FIG. 4 is a plan view showing a wiring configuration of a flexible circuit board.
Figure 5:
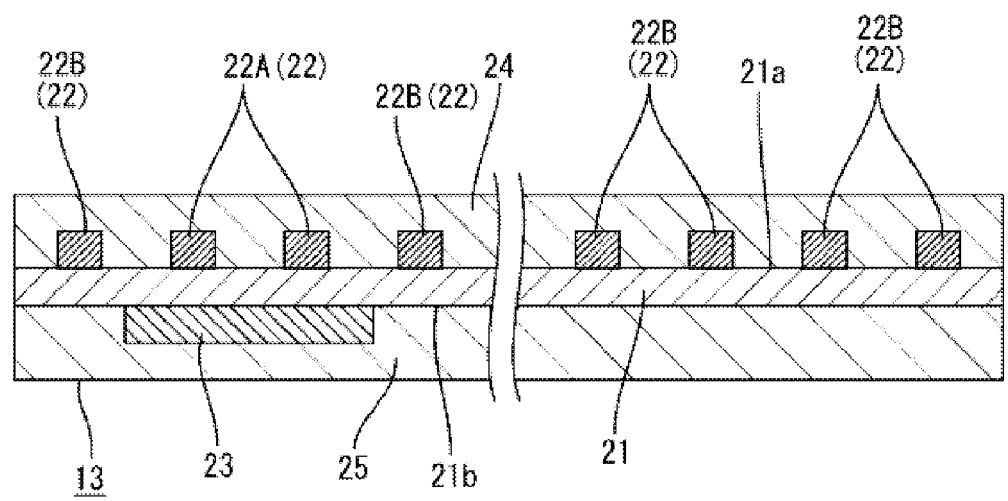
FIG. 5 is a cross-sectional view along the line v-v in FIG. 4.

A specific configuration is described. As shown in FIGS. 4 and 5, the flexible circuit board 13 has a film shaped insulating base material 21 formed of a polyimide resin or the like, a plurality of wiring patterns 22 formed on one surface 21a of the insulating base material 21, and a conductive layer 23 (hatched portion shown in FIG. 4) formed on the other surface 21b of the insulating base material 21. Furthermore, on the surface 21a of the insulating base material 21, a first insulating layer 24 is formed so as to cover the respective wiring patterns 22. On the other hand, on the other surface 21b, a second insulating layer 25 is formed so as to cover the conductive layer 23.

The insulating base material 21 has excellent flexibility because it is formed in a film shape. The insulating base material 21 is configured so as to extend along the extending direction (Y axis direction) of the wiring patterns 22, which are described later, and is bent mainly along a bend line that is parallel to a direction that intersects with the extending direction of the wiring patterns 22 (X axis direction, for example). The wiring patterns 22 are formed of a copper foil, which has excellent conductivity, or the like. On the surface 21a of the insulating base material 21, a plurality of wiring patterns 22 are disposed parallel to each other at prescribed intervals in the X axis direction, and extend along the Y axis direction while being parallel to each other. The intervals between the adjacent wiring patterns 22 are substantially equal. Here, in FIGS. 4 and 5, only eight wiring patterns 22 are shown for convenience. However, needless to say, a specific number of the wiring patterns 22 to be disposed can be appropriately changed.

Here, the wiring patterns 22 described above can be generally divided into two types depending on drive signals they transmit. Specifically, two wiring patterns 22, which are the second and third wiring patterns from left shown in FIGS. 4 and 5, are first wiring patterns 22A that transmit differential signals as drive signals. On the other hand, other wiring patterns 22 are second wiring patterns 22B that transmit drive signals that are not differential signals. Here, when differentiating the respective wiring patterns 22 below, a suffix "A" is added to the reference character of the first wiring patterns, and a suffix "B" is added to the reference character of the second wiring patterns. When generally referring to them without differentiating them, no suffix is added to the reference character.

To either one of the pair of first wiring patterns 22A, an original signal is transmitted. On the other hand, a signal in which the phase is reversed (opposite phase) compared the original signal is transmitted to the other one of the first wiring patterns 22A. The differential signals transmitted to the first wiring patterns 22A have a small voltage swing and a high frequency. Because of this, compared to signals transmitted to the second wiring patterns 22B, they are likely to deteriorate when they are affected by an external noise, and they may likely cause errors (malfunction) in display of the connected liquid crystal panel 11. Thus, in the present embodiment, the conductive layer 23 is formed on the other surface 21b of the insulating base material 21 to shield the first wiring patterns 22A. Furthermore, in the present embodiment, in order to form the conductive layer 23, below described features are provided so that flexibility of the flexible circuit board 13 is not lowered.

The conductive layer 23 is formed of a copper foil, which has excellent conductivity, or the like, and is constituted of a ground pattern, which is connected to a ground. As shown in FIGS. 4 and 5, the conductive layer 23 is formed only in a selected range with respect to the X axis direction on the other surface 21b of the insulating base material 21. Specifically, it is formed in a range overlapping the pair of first wiring patterns 22A when viewed in a plan view, but it does not overlap any of the respective second wiring patterns 22B when viewed in a plan view. More specifically, the conductive layer 23 has a width (length in the X axis direction) that is wider than the length obtained by adding the line widths of the respective first wiring patterns 22A and the interval between the first wiring patterns 22A, and extends by a prescribed length outside the respective first wiring patterns 22A, i.e., towards the sides of the respective second wiring patterns 22B that are adjacent to the respective first wiring patterns 22A. Thus, the conductive layer 23 is not formed in the entire area on the insulating base material 21 with respect to the X axis direction. It is formed in a limited (partial) manner in a region overlapping the first wiring patterns 22A, which need to be shielded, and the area of the insulating base material 21 that it covers is small. Therefore, flexibility of the flexible circuit board 13 can be retained at a sufficiently high level. The conductive layer 23 extends in the Y axis direction while being parallel to the respective wiring patterns 22, and overlaps the first wiring patterns 22A substantially along their overall lengths. This way, the first wiring patterns 22A can be suitably shielded, and it is possible to prevent an external noise from adversely affecting the differential signals to be transmitted.

Figure 6:
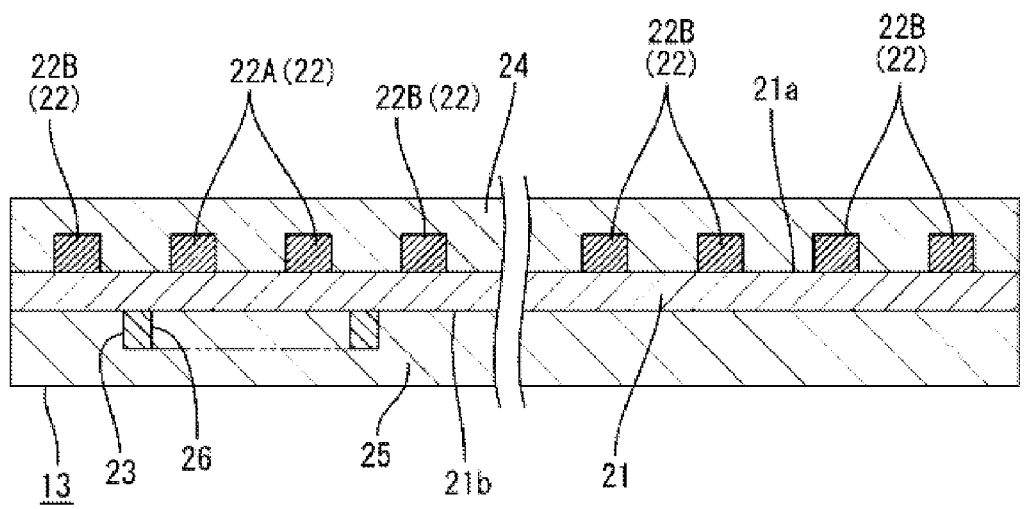
FIG. 6 is a cross-sectional view along the line vi-vi in FIG. 4.
Figure 6:
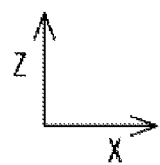

Further, as shown in FIGS. 4 and 6, in order to secure a high level of flexibility in the flexible circuit board 13, openings 26 are formed in the conductive layer 23. The openings 26 are configured to run through the conductive layer 23. Viewed in a plan view, the openings 26 form rectangular shapes. Their long side direction corresponds to the X axis direction, and their short side direction corresponds to the Y axis direction. The long side lengths of the openings 26 are longer than the length obtained by adding the line widths of the respective first wiring patterns 22A and the interval between the first wiring patterns 22A, but they are shorter than the width of the conductive layer 23. Therefore, the openings 26 form window shapes in the conductive layer 23, and run across the respective first wiring patterns 22A with respect to the X axis direction. In addition, the openings 26 are formed in a range straddling the first wiring patterns 22A adjacent to each other, and are further formed outside the respective first wiring patterns 22A, i.e., at locations that do not overlap the first wiring patterns 22A.

As described, the openings 26 are formed in regions reaching the outside of the respective first wiring patterns 22A. Therefore, the widths of their portions that overlap the respective first wiring patterns 22A are the same as the widths of the respective first wiring patterns 22A themselves, respectively. The openings 26 run across the center position between the first wiring patterns 22A, which are adjacent to each other, and form symmetrical shapes with respect to a symmetry axis L that is parallel to the first wiring patterns 22A. Therefore, when the openings 26 are divided into left and right portions by the symmetry axis L as the division shown in FIG. 4, the opening areas of the divided openings are equal to each other. By designing the openings 26 this way, the overlapping areas of the conductive layer 23 with respect to the respective first wiring patterns 22A are equal to each other. This way, the impedances of the respective first wiring patterns 22A can be made equal to each other. As a result, differential signals can be transmitted in an excellent manner by the respective first wiring patterns 22A.

Further, a plurality of openings 26 are arranged side by side in the Y axis direction. The intervals between the adjacent openings 26 in the Y axis direction, i.e., the arrangement pitches between the openings 26, are substantially equal to each other. The conductive layer 23 in which the openings 26 are formed in the above-mentioned arrangement substantially forms a ladder shape when viewed in a plan view.

As described, by arranging the plurality of openings 26, which are configured to extend in the X axis direction (direction orthogonal to the extending direction of the wiring patterns 22), side by side in the Y axis direction, it becomes easier to bend the flexible circuit board 13 when bending it along a bend line that is parallel to the X axis direction, for example, and the range of an angle at which the flexible circuit board 13 can be bent becomes wider. As a result, the flexible circuit board 13 can be bent at a sharp angle depending on the space where it is to be disposed, and it can be bent in a complex shape.

The present embodiment is configured as described above. Next, its function is described. To the terminals of the array substrate 11b of the liquid crystal panel 11, which are manufactured by a known manufacturing method, one end side of the flexible circuit board 13 is connected by pressure through the anisotropic conductive film (FIG. 1). Then, when attaching the liquid crystal panel 11 to the backlight device 14, the flexible circuit board 13 is bent along the bend line that is parallel to the X axis direction. Its cross-sectional view is made substantially into the shape of the letter "U", and its other end side is inserted into the connector 12a of the display control circuit board 12 disposed on the rear surface side of the chassis 14a.

Here, the conductive layer 23 is partially formed with respect to the X axis direction on the insulating base material 21. In addition, the openings 26 are formed in the conductive layer 23. Therefore, the flexible circuit board 13 retains a sufficient level of flexibility, and it is possible to prevent the flexible circuit board 13 from breaking and the like when bending it as described above. It can be bent at a particularly sharp angle or in a complex shape in a simple manner. After the liquid crystal panel 11 and the display control circuit board 12 are connected to each other through the flexible circuit board 13 as described above, they are stored inside the outer members 15 and 16. This way, the liquid crystal display device 10 is obtained.

When the power of the liquid crystal display device 10 obtained as described above is turned on, a drive signal according to a display image is supplied to the respective wires 19 and 20 in the liquid crystal panel 11 from the display control circuit board 12 through the flexible circuit board 13. This way, driving of the TFTs 17 is controlled, and light is radiated towards the liquid crystal panel 11 from the backlight device 14, thereby displaying a prescribed image on the display surface of the liquid crystal panel 11. Here, of the respective wiring patterns 22 in the flexible circuit board 13, a differential signal is transmitted to the first wiring patterns 22A as a drive signal. Compared to a signal transmitted to the second wiring patterns 22B, this differential signal is more likely to deteriorate when it is affected by an external noise, and has a high possibility of causing errors (malfunction) in display of the connected liquid crystal panel 11. In contrast, in the present embodiment, the conductive layer 23 is provided so as to overlap the first wiring patterns 22A, which are wiring patterns that transmit differential signals, among the respective wiring patterns 22. As a result, the first wiring patterns 22A can be suitably shielded, and adverse effects to the differential signals to be transmitted that can otherwise be caused by the external noise are avoided. This way, the differential signals can be supplied to the liquid crystal panel 11 without deteriorating, and it is possible to prevent a display error of the liquid crystal panel 11 from occurring. Thus, an excellent display quality can be obtained.

As described above, the flexible circuit board 13 of the present embodiment has the flexible insulating base material 21, the plurality of wiring patterns 22 formed at prescribed intervals on the surface 21a of the insulating base material 21, and the conductive layer 23 formed on the other surface 21b of the insulating base material 21. The conductive layer 23 is provided so as to overlap the first wiring patterns 22A, which is a select wiring pattern 22 among the plurality of wiring patterns 22.

This way, the plurality of wiring patterns 22 are formed on the surface 21a of the insulating base material 21. On the other hand, the conductive layer 23 is formed on the other surface 21b, and the conductive layer 23 is disposed so as to overlap the first wiring patterns 22A. As a result, the first wiring patterns 22A overlapping the conductive layer 23 can be suitably shielded. As the first wiring patterns 22A to be overlapped by the conductive layer 23 among the plurality of wiring patterns 22, if the wiring patterns 22 in which signals are particularly likely to deteriorate due to an external noise and the wiring patterns 22 that are affected more by the deterioration of the signals are selected, suitable anti-noise performance can be secured in the first wiring patterns 22A. Furthermore, the conductive layer 23 does not overlap all of the wiring patterns 22, and are disposed to overlap the first wiring patterns 22A, which is a select wiring pattern 22. Therefore, compared to a case in which the conductive layer is disposed to overlap all of the wiring patterns 22 and a case in which the conductive layer is arranged to be positioned in areas between all of the wiring patterns 22, the area of the conductive layer 23 disposed on the insulating base material 21 becomes smaller. Therefore, a high level of flexibility (pliability) can be secured.

Furthermore, the conductive layer 23 has the openings 26, which run through the conductive layer 23. This way, by forming the openings 26 in the conductive layer 23, the conductive layer 23 becomes less rigid, thereby making it easier to change its shape. As a result, the flexible circuit board 13 can be made even more flexible.

Furthermore, the openings 26 are disposed to overlap the first wiring patterns 22A, and are configured to run across the first wiring patterns 22A. This way, by forming the openings 26, which are configured to run across the first wiring patterns 22A, flexibility of the flexible circuit board 13 can be suitably secured.

Further, there are a pair (plurality) of first wiring patterns 22A overlapping the conductive layer 23. The openings 26 are formed such that the areas of the overlapping portions with respect to the respective first wiring patterns 22A are substantially equal to each other. This way, the areas of the overlapping portions of the openings 26 with respect to the respective first wiring patterns 22A are substantially equal. Therefore, electromagnetic effects of the conductive layer 23 on the respective first wiring patterns 22A become similar to each other. As a result, a difference in impedance becomes less likely to occur between the respective first wiring patterns 22A, and signals can be transmitted in an excellent manner.

Furthermore, the openings 26 have symmetrical shapes with respect to the symmetry axis L, which is parallel to the pair (plurality) of first wiring patterns 22A. This way, by forming the openings 26 in symmetrical shapes, a difference in impedance becomes even less likely to occur between the respective first wiring patterns 22A, and signals can be transmitted in an even more excellent manner.

Further, the openings 26 run across the first wiring patterns 22A and reach a region that does not overlap the first wiring patterns 22A. This way, the formation range of the openings 26 extends beyond the first wiring patterns 22A. As a result, the flexible circuit board 13 can be made even more flexible.

Further, there are a pair (plurality) of first wiring patterns 22A overlapping the conductive layer 23, and the openings 26 are formed so as to straddle the first wiring patterns 22A, which are adjacent to each other. This way, compared to a case in which an opening is individually formed in each of the respective first wiring patterns 22A, the respective openings of the openings 26 become larger. As a result, the flexible circuit board 13 can be made even more flexible. Furthermore, when the pitch between the first wiring patterns 22A is particularly very small, the openings 26 can be formed in the conductive layer 23 in a simple manner.

Further, the plurality of openings 26 are arranged side by side along the extending direction of the first wiring patterns 22A. This way, the flexible circuit board 13 can be made even more flexible.

Further, the openings 26 are disposed such that the intervals between the adjacent openings 26 are substantially equal. This way, by arranging the plurality of openings 26 at substantially equal pitches, flexibility of the flexible circuit board 13 can be made substantially uniform with respect to the extending direction of the wiring patterns 22.

Further, the first wiring patterns 22A overlapping the conductive layer 23 transmit a differential signal. The differential signal has a small voltage swing and a high frequency. Therefore, it is likely to deteriorate when it is affected by an external noise, and has a high possibility of causing malfunction in a connected device. By selectively shielding the first wiring patterns 22A, which transmit this differential signal, using the conductive layer 23, the differential signal can be suitably transmitted.

Further, the conductive layer 23 is configured to extend along the extending direction of the wiring patterns 22. This way, by using the conductive layer 23, which is configured to extend along the extending direction of the wiring patterns 22, the overlapping first wiring patterns 22A can be suitably shielded.

Further, the conductive layer 23 is a ground pattern. This way, the overlapping first wiring patterns 22A can be suitably shielded using the ground pattern.

Further, the liquid crystal display device 10 of the present embodiment has the flexible circuit board 13, the liquid crystal panel 11 that has the gate wires 19 and the source wires 20 as electrode wires and that performs display based on a drive signal supplied to the gate wires 19 and the source wires 20, and the display control circuit board 12, which controls transmission of the drive signal, wherein the liquid crystal panel 11 is connected to the display control circuit board 12 through the flexible circuit board 13. According to this liquid crystal display device 10, the flexible circuit board 13, which connects the liquid crystal panel 11 to the display control circuit board 12, has excellent flexibility. As a result, wiring can be performed in a more flexible manner, which is advantageous in obtaining a smaller size or the like.

Embodiment 2

Embodiment 2 of the present invention is described with reference to FIG. 7. In Embodiment 2, an embodiment in which the configuration of openings 126 formed in a conductive layer 123 is changed is shown. Here, redundant descriptions regarding structures, functions, and effects that are the same as those of Embodiment 1 described above are omitted.

Figure 7:
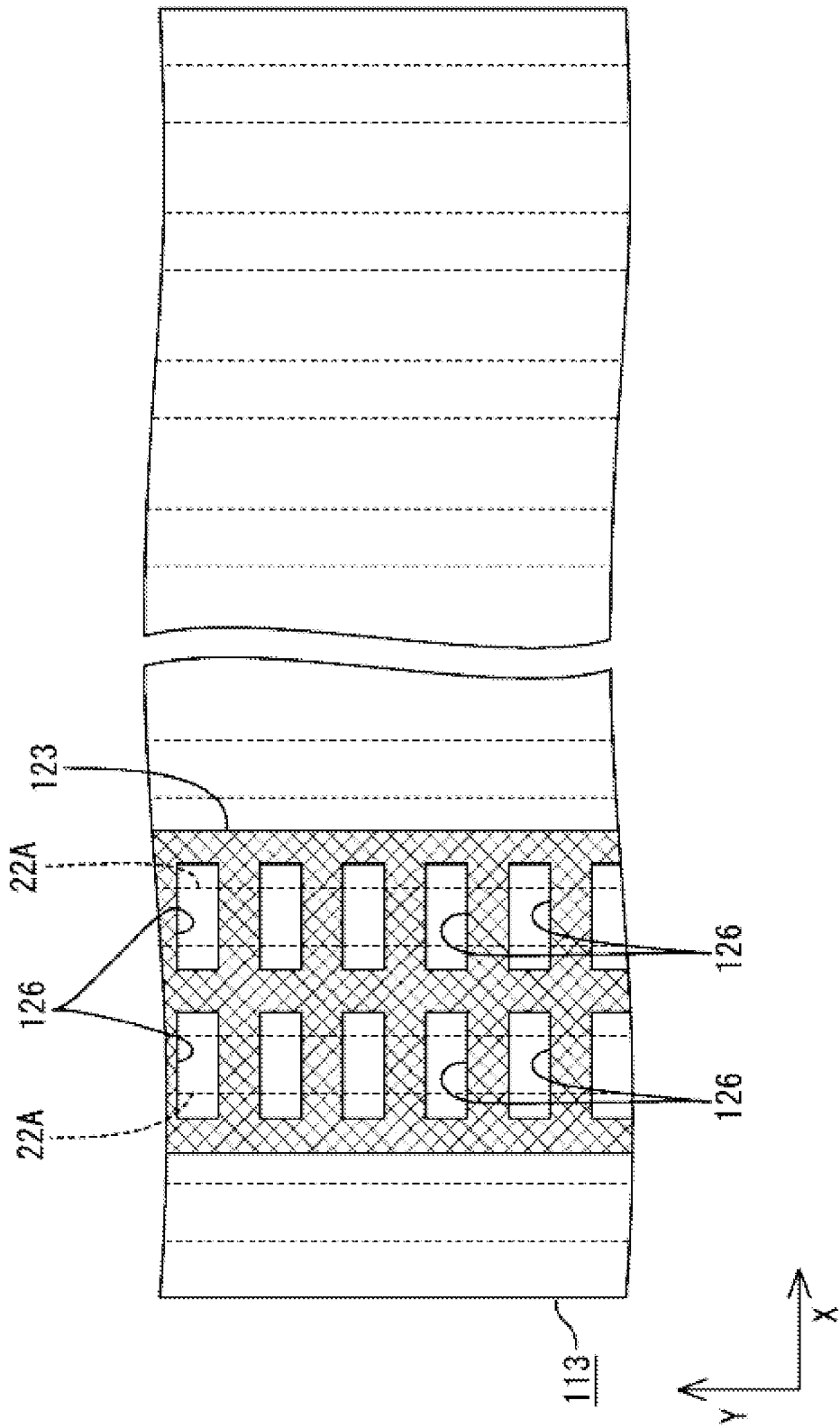
FIG. 7 is a plan view showing a wiring configuration of a flexible circuit board according to Embodiment 2 of the present invention.

As shown in FIG. 7, in the conductive layer 123 of a flexible board 113 according to the present embodiment, a pair of openings 126 are arranged side by side in the X axis direction corresponding to a pair of first wiring patterns 22A. The pair of openings 126 are arranged so as to individually overlap the respective wiring patterns 22A. More specifically, the respective openings 126 form horizontally long rectangular shapes viewed in a plan view, and are disposed to have the same center as the respective first wiring patterns 22A with respect to the X axis direction. The long side length of the opening 126 is longer than the line width of the first wiring pattern 22A. The opening 126 has a formation range in which both ends in the long side direction extend farther than both of the outer borders of the first wiring pattern 22A. The opening 126 runs through the center position of the first wiring pattern 22A in the widthwise direction, and has a symmetrical shape with respect to the symmetry axis L that is parallel to the first wiring pattern 22A. A pair of openings 126 that is adjacent to each other in the X axis direction has mutually the same shapes. As a result, electromagnetic effects of the conductive layer 123 on the respective first wiring patterns 22A are similar to each other, and a difference in impedance is less likely to occur between the pair of first wiring patterns 22A. Furthermore, a plurality of pairs of openings 126 are arranged side by side in the Y axis direction in a manner similar to that of Embodiment 1.

As described above, in the present embodiment, the opening 126 is individually formed corresponding to the respective first wiring patterns 22A. As a result, the area of the conductive layer 123 is larger than the conductive layer 23 (see FIG. 4) shown in Embodiment 1. Therefore, anti-noise performance (shield performance) of the first wiring patterns 22A can be improved.

Other Embodiments

The present invention is not limited to the embodiments described using descriptions and figures above. The following embodiments are included in the technical scope of the present invention, for example.

Figure 8:
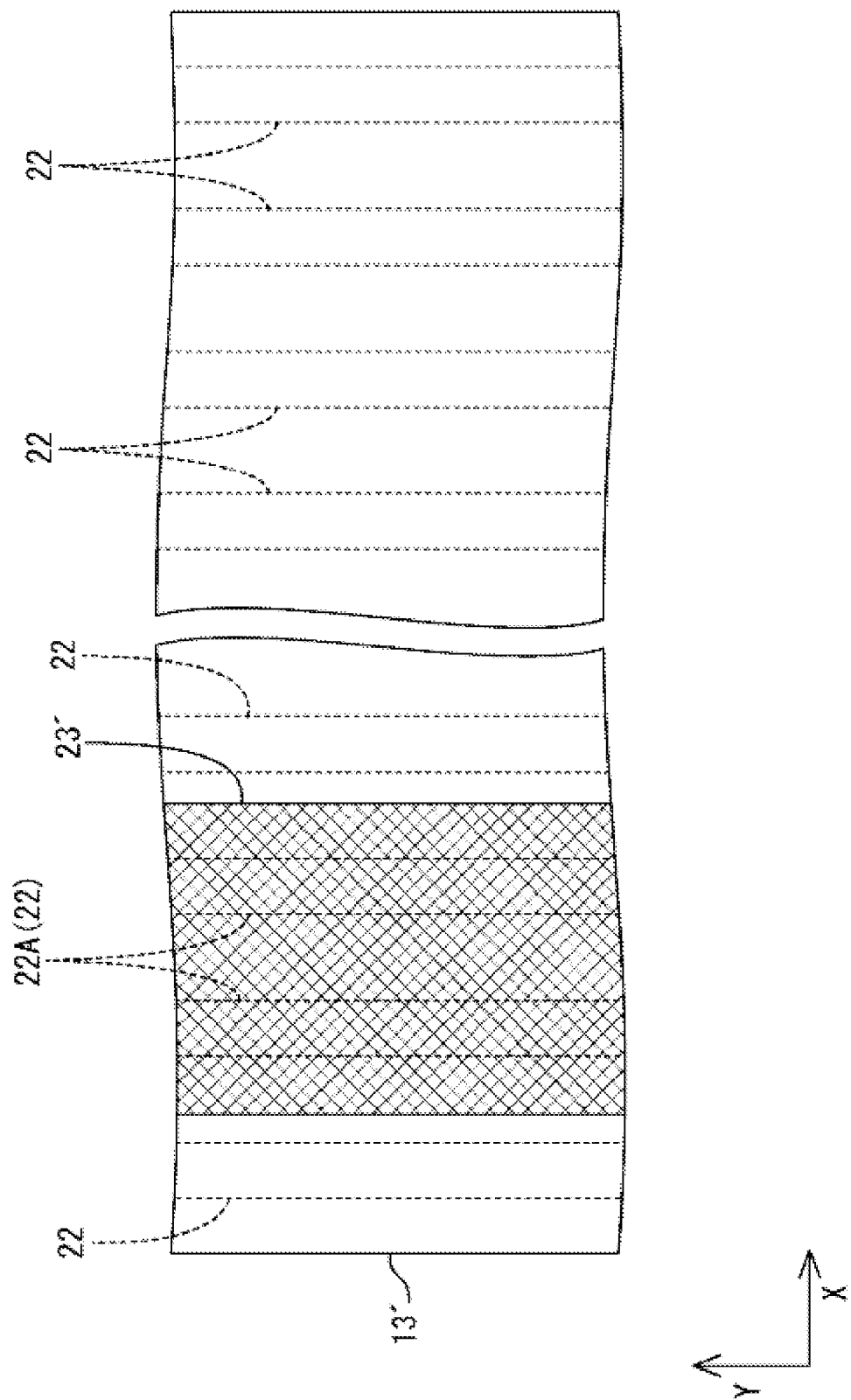
FIG. 8 is a plan view showing a wiring configuration of a flexible circuit board according to another embodiment (1).

(1) The respective embodiments described above showed conductive layers in which the openings are formed. However, as shown in FIG. 8, a conductive layer 23' in which openings are not formed is also included in the present invention. Even in this case, as long as the conductive layer 23' is formed in a range overlapping a select wiring pattern 22 (first wiring patterns 22A) instead of forming it in a range overlapping all of the wiring patterns 22, it is possible to sufficiently secure flexibility of a flexible circuit board 13'.

(2) The respective embodiments described above showed embodiments in which the areas of portions of openings overlapping the respective first wiring patterns are equal to each other. However, embodiments in which the areas of portions of the openings overlapping one of the first wiring patterns and the areas of portions of the openings overlapping the other one of the first wiring patterns have different sizes are also included in the present invention.

(3) The respective embodiments described above showed the openings that have a wider formation range than the line width of the first wiring pattern. However, openings that have the same formation range as the line width of the first wiring pattern and openings that have a narrower formation range than the line width of the first wiring pattern are also included in the present invention. In other words, in addition to the openings that are configured to overlap the entire width of the first wiring pattern, openings that are configured to partially overlap the first wiring pattern with respect to the widthwise direction are included in the present invention.

(4) The respective embodiments described above showed the openings having symmetrical shapes. However, openings having asymmetrical shapes are also included in the present invention. Further, the planar shape of the opening is not limited to a rectangular shape, and can be changed to a polygonal shape such as a square, a triangle, or the like, as well as a circular shape, an elliptical shape, or the like.

(5) The respective embodiments described above showed embodiments in which the openings are formed in regions overlapping the first wiring patterns and in regions that do not overlap the first wiring patterns or the second wiring patterns. However, embodiments in which the openings are formed only in regions overlapping the first wiring patterns and are not formed in regions that do not overlap the first wiring patterns or the second wiring patterns are also included in the present invention. On the other hand, embodiments in which the openings are formed only in regions that do not overlap the first wiring patterns or the second wiring patterns, and are not formed in regions overlapping the first wiring patterns or the second wiring patterns are also included in the present invention.

(6) The respective embodiments described above showed embodiments in which there are two first wiring patterns overlapped by the conductive layer. However, the number of the first wiring patterns to be overlapped by the conductive layer may be changed to one or three or more. In the respective embodiments described above, signals transmitted to the first wiring patterns are differential signals. Because of this, the number of the first wiring patterns to be overlapped by the conductive layer preferably is an even number such as 4, 6, or the like.

(7) The respective embodiments described above showed cases in which the signals transmitted by the first wiring patterns are differential signals. However, other types of signals may be transmitted.

(8) The respective embodiments described above showed the wiring patterns in straight line shapes as an example. However, wiring patterns containing a curved portion are also included in the present invention.

(9) The respective embodiments described above showed a case in which the conductive layer is formed of a ground pattern, which is connected to the ground. However, embodiments in which the conductive layer is not connected to the ground are also included in the present invention.

(10) The respective embodiments described above showed embodiments having the second insulating layer that covers the conductive layer provided on the flexible circuit board. However, the second insulating layer may be omitted. In that case, it is possible to form a ground connection by bringing the conductive layer, which is exposed to the outside, into direct contact with a chassis or the like.

(11) The respective embodiments described above showed flexible circuit boards that are directly connected to the terminals of the liquid crystal panel as an example. However, a flexible circuit board that is connected to another circuit board connected to the terminals of the liquid crystal panel is also included in the present invention, for example.

(12) The respective embodiments described above showed the terminals of the liquid crystal panel disposed at an end of the array substrate on the side of its short side. However, embodiment in which the terminals are disposed at an end of the array substrate on the side of its long side are also included in the present embodiment.

(13) The respective embodiments described above showed a transmissive liquid crystal display device having a backlight device, which is an external light source. However, the present invention can be applied in a reflective liquid crystal display device that performs display using an external light. In that case, the backlight device can be omitted.

(14) In the respective embodiments described above, TFTs were used as the switching elements of the liquid crystal display device. However, the present invention can be applied in a liquid crystal display device that uses switching elements other than TFTs (thin film diode (TFD), for example). Other than the liquid crystal display device that performs color display, the present invention can also be applied to a liquid crystal display device that performs black and white display.

(15) The respective embodiments described above showed a liquid crystal display device using a liquid crystal panel as the display panel as examples. However, the present invention can be applied to a display device that uses other types of display panel.

(16) In addition to the respective embodiments described above, the specific size of a short side length of the opening formed in the conductive layer can be appropriately changed. Openings having the short side length that is longer than an arrangement pitch between the openings adjacent to each other in the Y axis direction and openings having the short side length that is shorter than the arrangement pitch are included in the present invention. Furthermore, openings having the short side length that is the same size as the arrangement pitch are also included in the present invention. Here, the smaller the short side lengths (areas) of the openings, the larger the overlapping area of the conductive layer with respect to the first wiring patterns. Because of this, the impedance of the first wiring patterns tends to decrease. Therefore, the short side lengths (areas) of the openings preferably are set to an appropriate size in order to obtain a desired impedance.

DESCRIPTION OF REFERENCE CHARACTERS 10 liquid crystal display device (display device)
11 liquid crystal panel (display panel)
12 display control circuit board (display control circuit)
13, 113 flexible circuit boards
19 gate wires (electrode wires)
20 source wires (electrode wires)
21 insulating base material
22 wiring patterns
22A first wiring patterns (select wiring patterns)
23, 123 conductive layers
26, 126 openings
L symmetry axis

The invention claimed is:
1. A flexible circuit board, comprising:
a flexible insulating base material;
a plurality of wiring patterns formed at prescribed intervals on one surface of said insulating base material; and
a conductive layer formed on another surface of said insulating base material, the conductive layer being a ground pattern,
wherein said conductive layer is disposed so as to overlap only select one or more of the wiring patterns among the plurality of wiring patterns so as not to overlap all of the wiring patterns.

2. The flexible circuit board according to claim 1, wherein an opening that runs through said conductive layer is provided in said conductive layer.

3. The flexible circuit board according to claim 2, wherein said opening is disposed to overlap said select one or more of wiring patterns, and runs across said select one or more of the wiring patterns.

4. The flexible circuit board according to claim 3, wherein said select one or more of the wiring patterns overlapping said conductive layer are constituted of a plurality of said wiring patterns, and
wherein said opening is formed such that areas of portions of said opening overlapping respective said wiring patterns constituting said select one or more of the wiring patterns are substantially equal to each other.

5. The flexible circuit board according to claim 4, wherein said opening has a symmetrical shape with respect to a symmetry axis that is parallel to a plurality of said wiring patterns constituting said select one or more of the wiring patterns.

6. The flexible circuit board according to claim 3, wherein said opening is also formed in regions that do not overlap said select one or more of the wiring patterns.

7. The flexible circuit board according to claim 6, wherein said select one or more of the wiring patterns overlapping said conductive layer are constituted of a plurality of said wiring patterns, and
wherein said opening is formed so as to straddle said wiring patterns that are adjacent to each other.

8. The flexible circuit board according to claim 3, wherein a plurality of said openings are arranged side by side along an extending direction of said select one or more of the wiring patterns.

9. The flexible circuit board according to claim 8, wherein said openings are arranged such that intervals between said openings that are adjacent to each other are substantially equal.

10. The flexible circuit board according to claim 1, wherein said select one or more of the wiring patterns overlapping said conductive layer include a wiring pattern that transmits a differential signal.

11. The flexible circuit board according to claim 1, wherein said conductive layer extends along an extending direction of said wiring patterns.

12. A display device, comprising:
a flexible circuit board according to claim 1;
a display panel that has an electrode wiring and that performs display based on a drive signal supplied to said electrode wiring; and
a display control circuit that controls transmission of said drive signal,
wherein said display panel and said display control circuit are connected to each other by said flexible circuit board.

13. The display device according to claim 12, wherein said display panel is a liquid crystal panel formed by encapsulating liquid crystal between a pair of substrates.

14. A flexible circuit board, comprising:
a flexible insulating base material;
a plurality of wiring lines extending generally in a prescribed direction at prescribed intervals, formed on one surface of said insulating base material; and
a ground pattern formed on another surface of said insulating base material, the ground pattern extending generally in said prescribed direction and overlapping only select one or more of the plurality of wiring lines that are adjacent to each other among said plurality of wiring lines so as not to overlap all of said plurality of wiring lines.

15. The flexible circuit board according to claim 14, wherein the ground pattern has a plurality of generally rectangular openings arranged in said prescribed direction, and each of the plurality of said generally rectangular openings extends in a direction perpendicular to said prescribed direction and straddles all of said select one or more of the wiring lines.

* * * * *